(12) United States Patent
Chang

(10) Patent No.: US 7,223,650 B2
(45) Date of Patent: May 29, 2007

(54) SELF-ALIGNED GATE ISOLATION

(75) Inventor: Peter Chang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/196,533

(22) Filed: Oct. 12, 2005

(65) Prior Publication Data

US 2007/0080380 A1    Apr. 12, 2007

(51) Int. Cl.
  *H01L 21/8238* (2006.01)
  *H01L 29/80* (2006.01)
(52) U.S. Cl. .................... 438/221; 438/229; 438/230; 438/296; 438/299; 257/274; 257/338; 257/351
(58) Field of Classification Search ............. 438/221, 438/229, 230, 296, 299; 257/274, 338, 351, 257/510
See application file for complete search history.

(56) References Cited

U.S. PATENT DOCUMENTS

2005/0035427 A1* 2/2005 Park et al. .................. 257/510
2005/0179072 A1* 8/2005 Rhodes ....................... 257/291
2006/0043464 A1* 3/2006 Tsunoda et al. ............. 257/316

OTHER PUBLICATIONS

Peter L.D. Chang, "Memory with Split Gate Devices and Method of Fabrication", U.S. Appl. No. 10/816,282, filed Mar. 31, 2004.
Peter L.D. Chang, "Memory Cell Using Silicon Carbide", U.S. Appl. No. 10/874,557, filed Jun. 22, 2004.
Brian Doyle et al., "Independently Accessed Double-Gate and Tri-Gate Transistors in Same Process Flow", U.S. Appl. No. 10/955,670, filed Sep. 29, 2004.
Peter L.D. Chang, "Method for Isolating Semiconductor Device Structures and Structures Thereof", U.S. Appl. No. 10/956,320, filed Sep. 30, 2004.
Peter L.D. Chang, "Self-Aligned Contacts for Transistors", U.S. Appl. No. 11/097,429, filed Mar. 31, 2004.
Peter L.D. Chang, "Independently Accessed Double-Gate and Tri-Gate Transistors in Same Process Flow", U.S. Appl. No. 11/124,572, filed May 4, 2005.

* cited by examiner

*Primary Examiner*—Hsien-Ming Lee
(74) *Attorney, Agent, or Firm*—Rahul D. Engineer

(57) ABSTRACT

Embodiments of the invention include a circuit with a transistor having a self-aligned gate. Insulating isolation structures may be formed, self-aligned to diffusions. The gate may then be formed self-aligned to the insulating isolation structures.

19 Claims, 19 Drawing Sheets

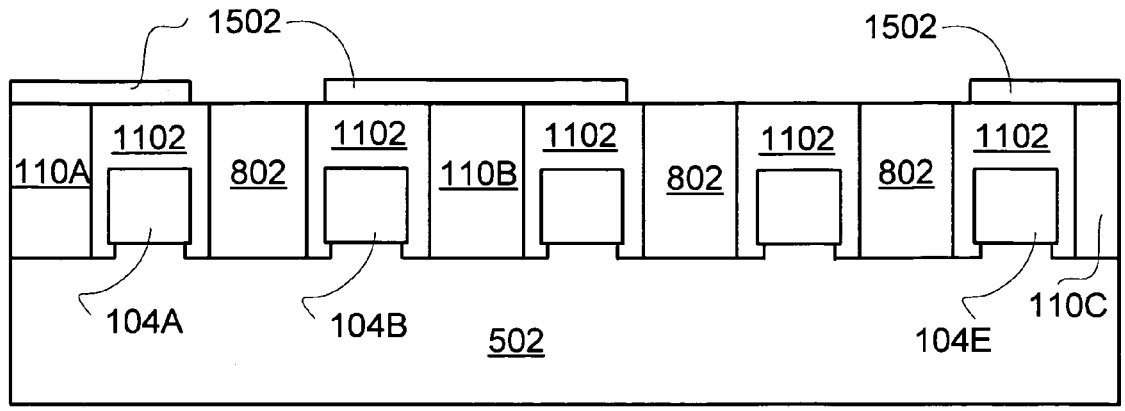
Fig. 15a
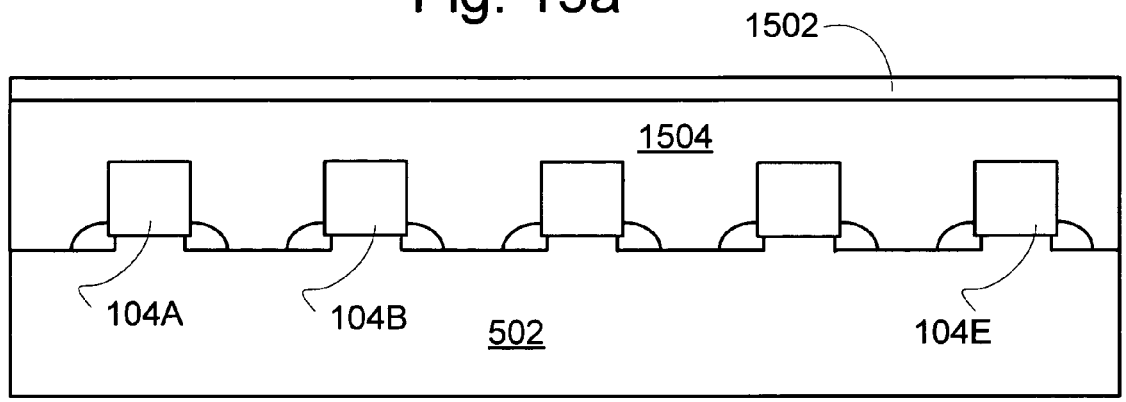
Fig. 15b
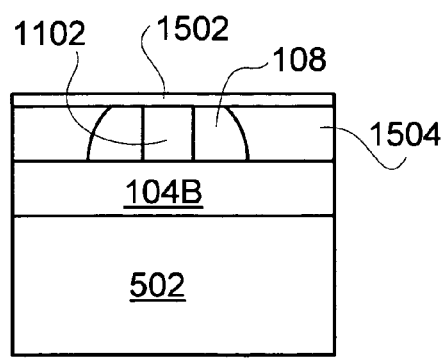 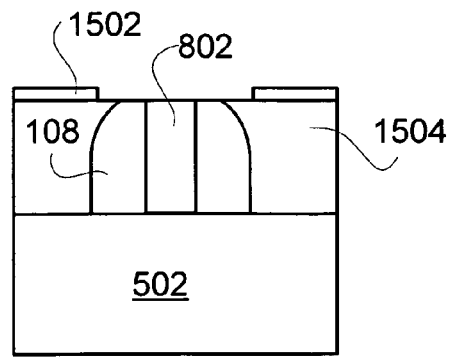
Fig. 15c  Fig. 15d

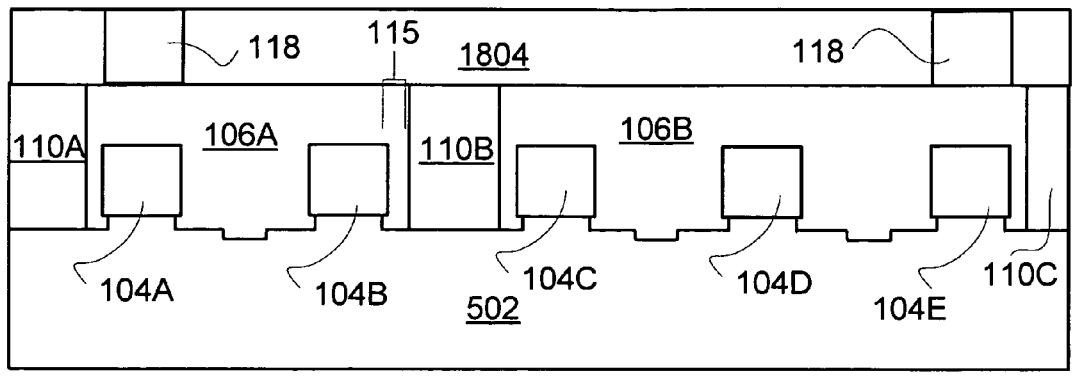
Fig. 18a
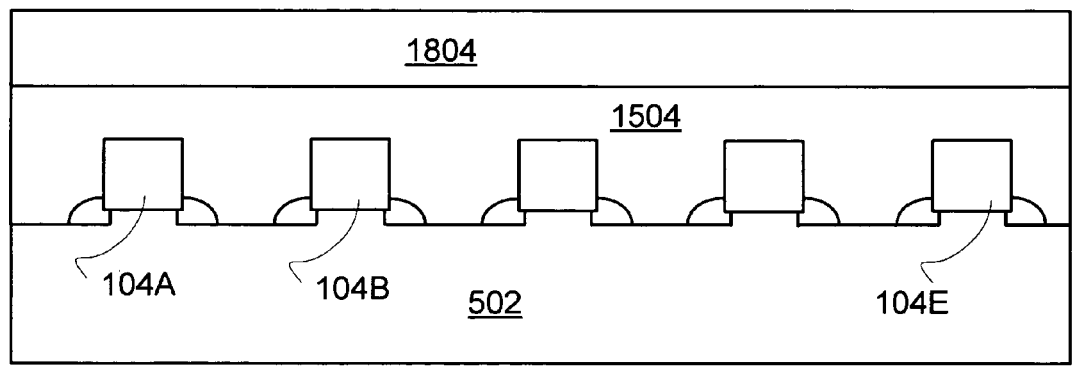
Fig. 18b
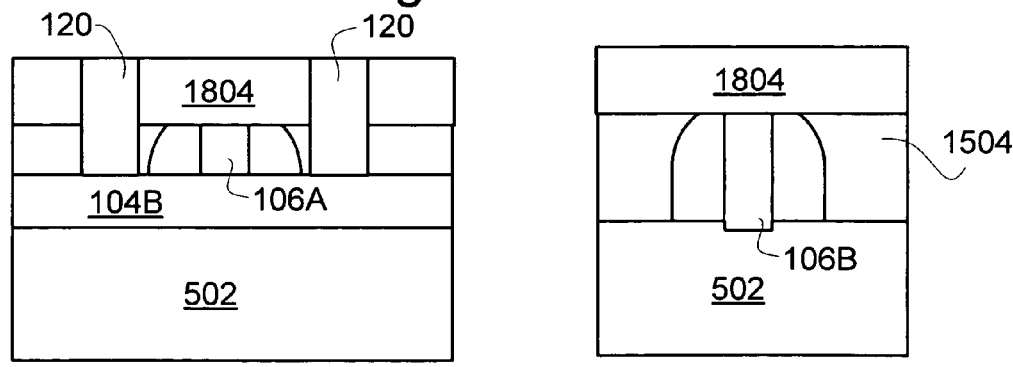
Fig. 18c
Fig. 18d

US 7,223,650 B2

SELF-ALIGNED GATE ISOLATION

BACKGROUND

Background of the Invention

Increasingly complex electronic systems require increasingly denser structures of active devices such as transistors. For example, memory cells, such as SRAM cells, are becoming smaller. It is becoming more difficult to further reduce the size of transistors to continue shrinking SRAM cells.

FIG. 1a is a top view of a SRAM cell 10 during its fabrication. There are multiple diffusions 14 on a substrate 12. These diffusions 14 will become parts of transistors. There is an alignment mark 18 on the substrate 12. This alignment mark allows a fabrication system to align the substrate 12 to pattern additional features and structures on the substrate 12. However, such an alignment method is not perfect; there is a margin of alignment error. There is a distance between diffusions, for example distance 20 between diffusions 14A and 14D. This distance 20 is larger than it would be were there no alignment errors in the alignment system, which results in a SRAM cell being larger than it would be absent alignment errors.

FIG. 1b is a top view of the cell 10 after formation of gates 16 on the diffusions 14. Each gate 16 has a width 26. For the transistor shown in FIG. 1b to function, there must be a polysilicon gate 16A that extends past the diffusion 14A for a minimum distance 21. This distance of the gate 16A extending beyond the diffusion 14A is referred to as the endcap. Because of alignment errors, the end of gate 16A may be anywhere in the location range 22, not just to the minimum distance 21, the endcap may extend significantly further than distance 21. Another consideration for poly endcap is the lithography capabilities in defining the lines and shapes near the poly end. The end of the endcap may be rounded instead of squared. Such rounded endcaps may require even longer poly endcaps. Thus, the alignment error and poly end patterning limitation, combined with minimum distance 21 means that significant extra space must be left for the end cap.

The distance 24 between gates 16A and 16B is greater than or equal to the minimum resolution of the lithography system used to make the gate 16A and 16B. Thus, combining the extra space needed by the minimum poly end distance 21, the possible alignment error, poly end patterning limitation, and the distance 24 between gates 16A and 16B can result in a lower limit to the size of an SRAM cell 10.

BRIEF DESCRIPTION OF THE DRAWINGS

FIGS. 15a–15d illustrate the circuit after a layer of interlayer dielectric is deposited and planarized and the remaining portions of the hardmask layer have been removed.

FIGS. 18a–18d illustrate the circuit after formation of the gates and a second ILD layer and contacts.

DETAILED DESCRIPTION

In various embodiments, an apparatus and method relating to the formation of a device are described. In the following description, various embodiments will be described. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

The exemplary embodiments of the present invention pertain to forming self-aligned gates on transistors. The gates may be self-aligned to isolation structures insulating gates from each other. By using a self-aligning method to form gates, alignment errors of lithographic systems may be avoided, and smaller SRAM or other circuits may be formed without having to shrink transistor size.

Figure 1A:
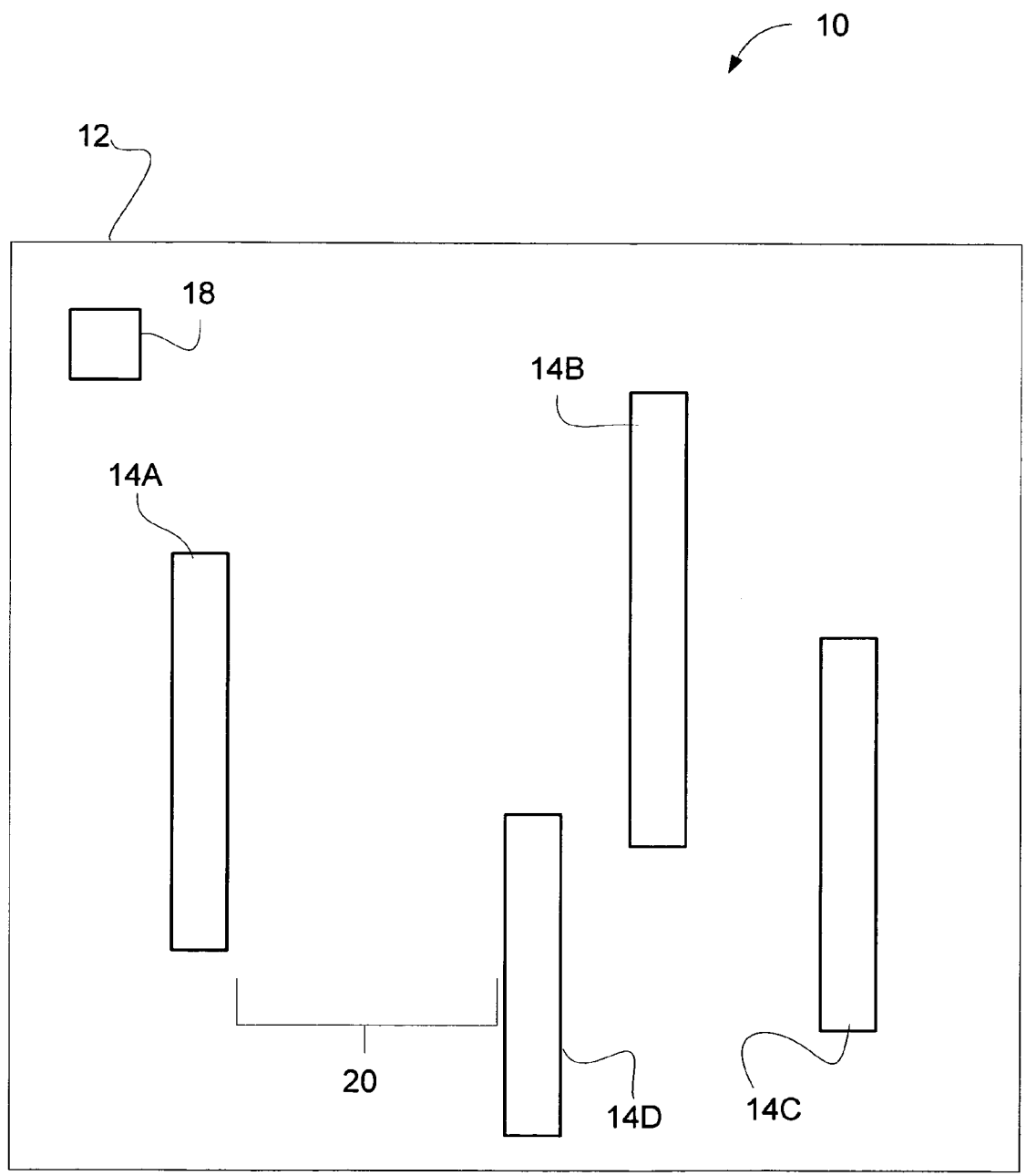
FIG. 1a is a top view of a SRAM cell during its fabrication.
Figure 1B:
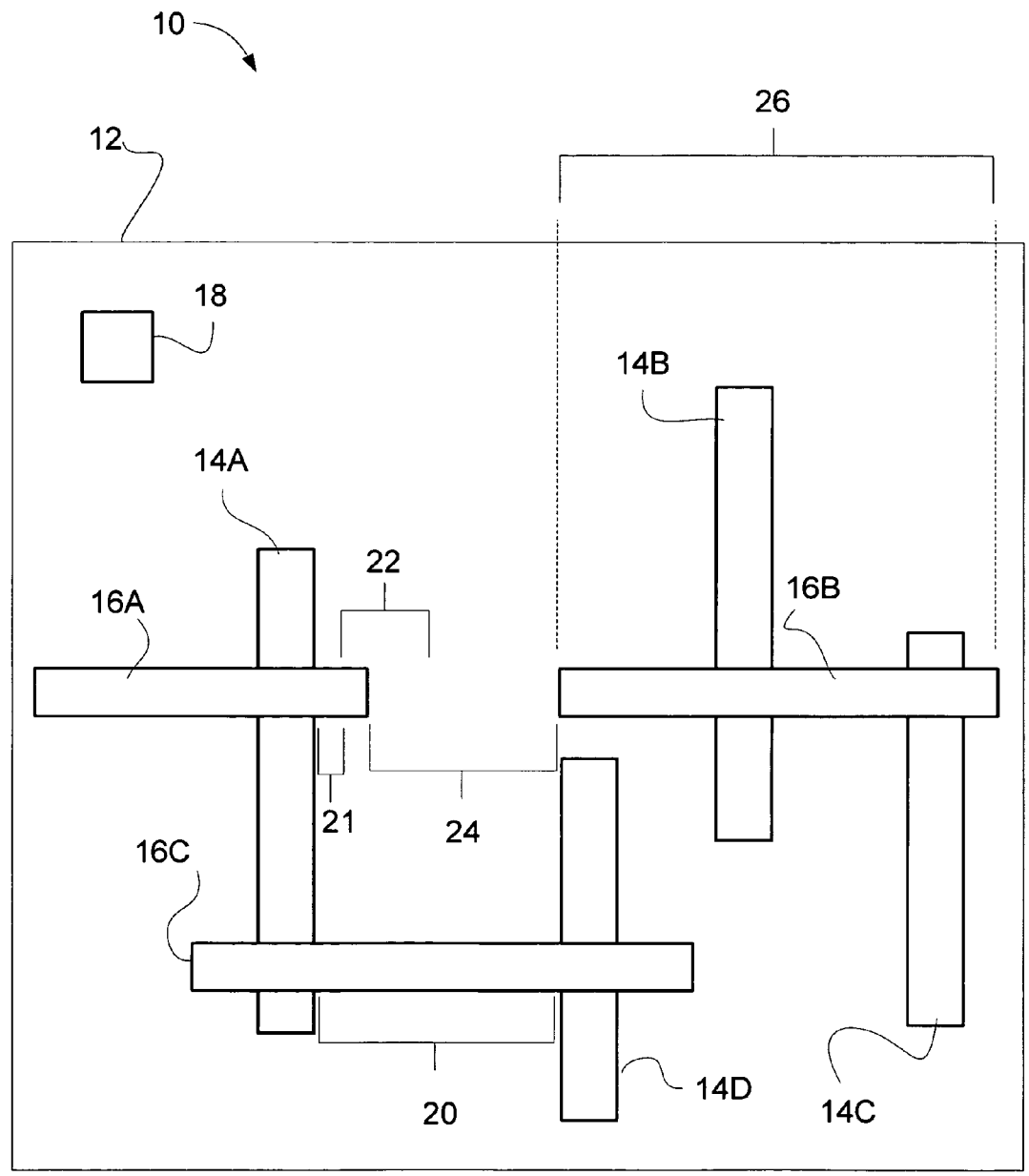
FIG. 1b is a top view of the cell after formation of gates on the diffusions.
Figure 2:
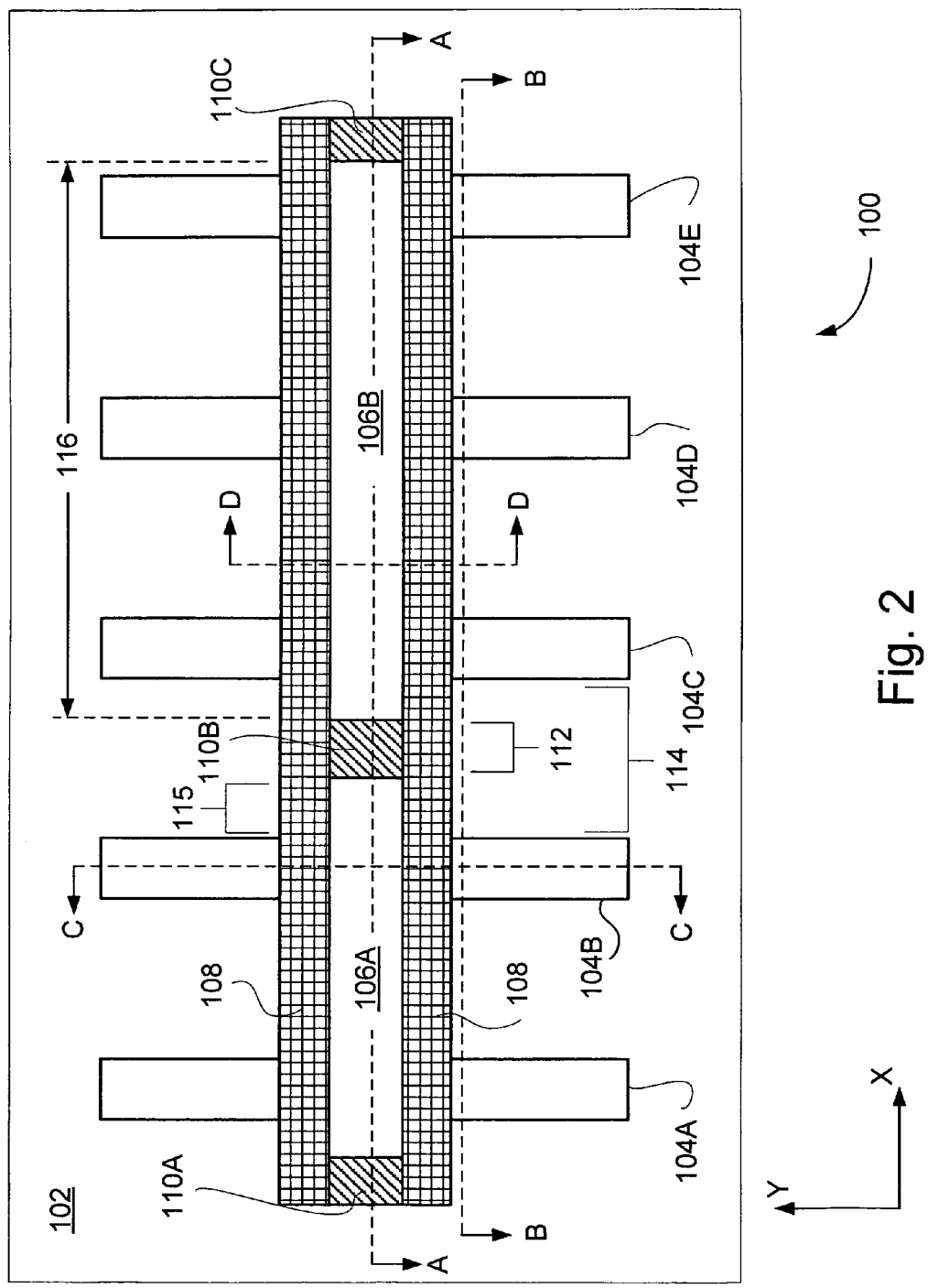
FIG. 2 is a top view that illustrates a portion of a circuit that includes transistors with gates self-aligned to isolation structures that insulate the gates from each other.

FIG. 2 is a top view that illustrates a portion of a circuit 100 that includes transistors with end caps of gates 106 self-aligned to diffusions 104, according to one embodiment of the present invention. The self-alignment of gates 106 to diffusions 104 may solve the problems related to the poly endcap and end-to-end and allow SRAM cells to become smaller. The self-alignment may be accomplished by forming gate isolation structures 110 self-aligned to the diffusion 104, and forming the gates 106 self-aligned to the isolation structures 110. The transistors may be on a substrate 102. The isolation structures 110 may have a width 112 that determines the distance between adjacent gates 106. Because in some embodiments it is the width 112 of the isolation structures 110 that define the distance between gates 106, the placement of the gates 106 may not be dependent on the accuracy of a lithography system or the resolution limit (critical dimension) of the lithography system, and the distance 114 between diffusions 104 and gates 106 may be smaller than if the placement of gates 106 were dependent on the alignment and minimum resolution of a lithography system, and had to take alignment errors and critical dimensions into account. Additionally, the gates 106 may have an endcap width 115 that may be defined by the self-aligning process. As pictured in FIG. 2, the diffusions 104 have a major axis in the Y direction and a minor axis in the X direction; the gates 106 have a length in the Y direction and a width in the X direction.

In addition to diffusions 104 and gates 106, the circuit 100 may include spacers 108 on either side of the gates 106. The embodiment of the circuit 100 shown in FIG. 2 includes five diffusions 104A–104E, although some diffusions (104A and 104E) are dummy diffusions. Dummy diffusions 104 are diffusions 104 on which active transistors are not formed, but may instead be used to make contacts to gates 106 of active transistors, aid in aligning and/or separating adjacent active transistors from each other, or other uses. In some embodiments, the dummy diffusions may add parasitic capacitances to active gates. The parasitic capacitance can be reduced significantly by prevention of ion implantation into the dummy diffusions. For some circuits, such as a memory cell, the additional capacitances are negligible compared to those of bit lines or word lines, and thus may be ignored. In some embodiments, the parasitic capacitance may be eliminated by using lithographically defined isolations, such as isolation 110A, instead and omitting the dummy diffusions. The embodiment of the circuit 100 shown in FIG. 2 includes two gates, 106A and 106B. The width of the gates 106 may be defined by the placement of the isolation structures 110, as will be described in more detail below. For example, the width 116 of gate 106B is defined by the placement of isolation structures 10B and 110C on either side of that gate 106B. The length of gates 106 (the distance between the spacers 108 in FIG. 2) may be defined by lithography. Lines A—A, B—B, C—C, and D—D illustrate the locations through which cross-sectional views described below are taken.

Figure 3:
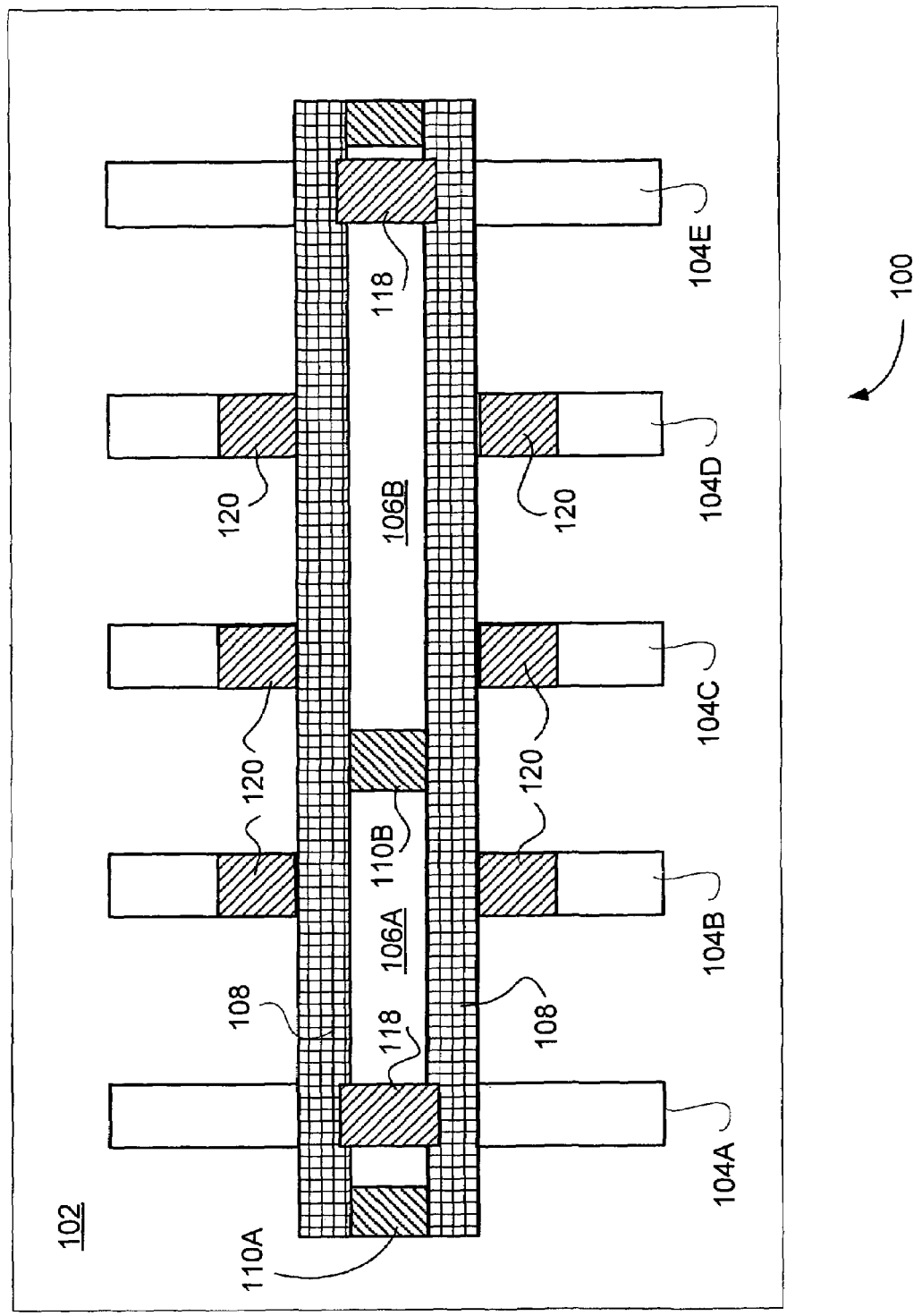
FIG. 3 is a top view of the circuit that illustrates additional structures that may be present in some embodiments.

FIG. 3 is a top view of the circuit 100 that illustrates additional structures that may be present in some embodiments of the present invention, to provide more clarity on the functional details of a transistor of the circuit 100. For example, a first transistor may include diffusion 104B, gate 106A with a width defined by the distance between isolation structures 110A and 110B, and spacers 108 on either side of the gate 106A. The first transistor may also include contacts 118, 120. There may be a gate contact 118, which in this embodiment is illustrated as being electrically connected to the gate 106A and located in a position above dummy diffusion 104A. There may also be source and drain contacts 120, located above diffusion 104B. In some embodiments, placing the gate contact 118 over dummy diffusion 104A and source and drain contacts 120 over active diffusions 104B (or vice versa) may prevent shorts between the gate contact 118 and the source/drain contacts 120. In other embodiments, all contacts 118, 120 may be over an active diffusion 104B, over a dummy diffusion 104A, or have other arrangements.

Figure 4:
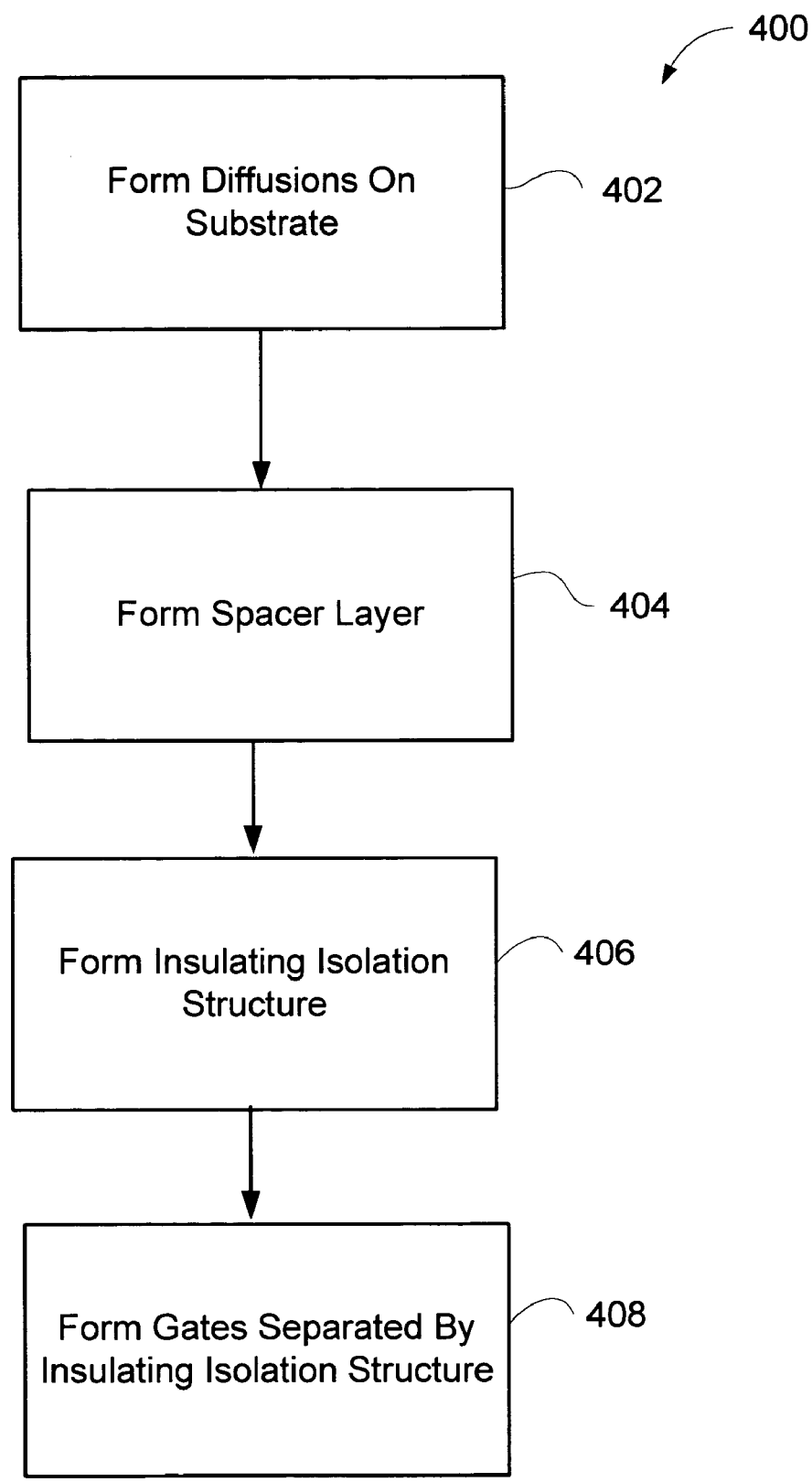
FIG. 4 is a flow chart that provides an overview of how a gate that is self-aligned to insulating isolation structures may be fabricated.

FIG. 4 is a flow chart 400 that provides a general overview of how a gate 106 that is self-aligned to diffusions 104, such as gate 106A self-aligned to diffusion structures 104 of FIGS. 2 and 3, may be fabricated according to one embodiment of the present invention. Diffusions 104 may be formed 402 on a substrate 102. Spacer layers 806 may be formed 404 on the diffusions. Insulating isolations structures 110 may be formed 406 between the diffusions at positions determined by the spacer layers 806. Then gates 106 may be formed 408. The distance between insulating isolation structures 110 may determine the width of gates 106. As the insulating isolation structures are self-aligned to the diffusions 104, the gates 106 are thus self-aligned to the diffusions 104, which may aid in keeping the size of the circuit 100 small. While FIG. 4 is very general and omits many steps and processes used to form the self-aligned gate 106, fabrication of such self-aligned gates 106 is described below in more detail, using selected embodiments as specific examples. Other embodiments may use different processes and materials to form a self-aligned gate 106.

Figure 5:
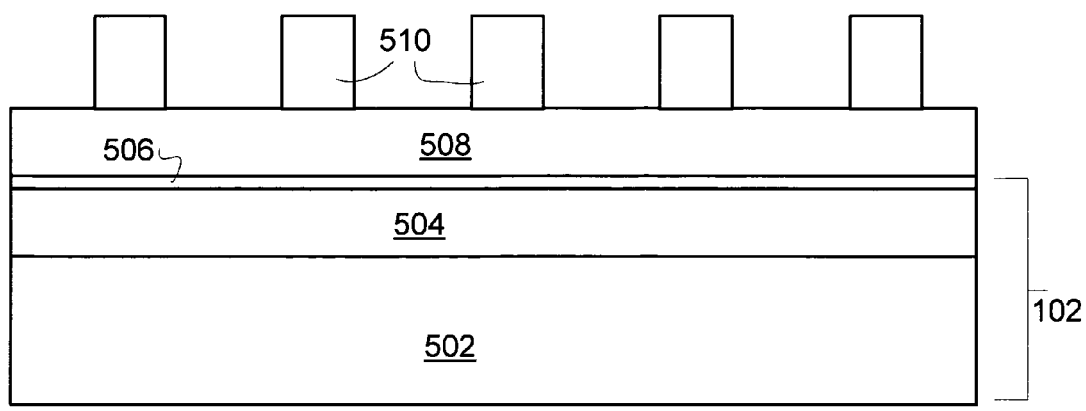
FIG. 5 is a cross-sectional side view that illustrates the circuit in an early stage of its fabrication.

FIG. 5 is a cross-sectional side view, taken through line A—A of FIG. 2, that illustrates the circuit 100 in an early stage of its fabrication, according to one embodiment of the present invention. In the embodiment illustrated in FIG. 5, the substrate 102 is a silicon-on-insulator (SOI) substrate, and includes a buried oxide layer 502, a semiconductor layer 504, and a pad oxide layer 506, and a hard mask layer 508 and patterned photoresist segments 510 are on the substrate 102. In other embodiments, the substrate 102 may be a different type of substrate, such as a bulk silicon wafer. The photoresist segments 510 may be patterned to be used to define the diffusions 104. The various layers of the substrate 102 and the hardmask layer 508 and photoresist may comprise any suitable material and be of any suitable thickness. In an embodiment, the materials for the hardmask layer 508 and substrate 102 may be selected to allow etching that is selective between these structures and other structures, some of which may be formed subsequent to the hardmask layer 508. In an embodiment, the semiconductor layer 504 of the substrate 102 may comprise single crystal silicon and the hardmask layer 508 may comprise SiON on polysilicon. In addition to or in place of some material combinations being chosen for etch selectivity, some materials used in forming the circuit 100 may be chosen to act as polish stops.

Figure 6:
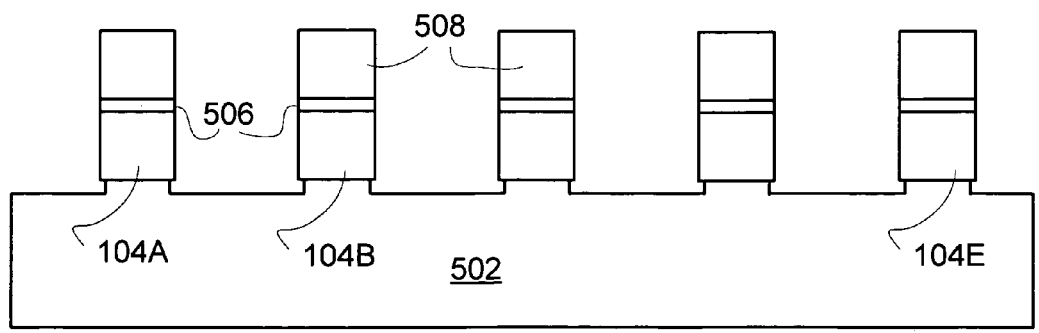
FIG. 6 is a cross-sectional side view that illustrates the circuit after formation of the diffusions.

FIG. 6 is a cross-sectional side view, taken through line A—A of FIG. 2, that illustrates the circuit 100 after formation of the diffusions 104, according to one embodiment. The patterned photoresist 510 and a suitable etching method have been used to remove portions of the hardmask layer 508, the pad oxide layer 506, and the semiconductor layer 504. The remaining photoresist 510 may then have been removed and the resulting structure cleaned. This may have formed diffusions 104, each isolated from each other in embodiments where the substrate 102 is an SOI substrate. In other embodiments, such as when the substrate 102 is a bulk substrate, the formed diffusions 104 may not be isolated from each other by the buried oxide layer 502 illustrated in FIG. 6. As illustrated in the embodiment of FIG. 6, the etching and/or cleaning process may have removed a portion of the buried oxide layer 502 and may have undercut the diffusions 104 to some extent, although in some other embodiments such undercutting may be absent.

Figure 7:
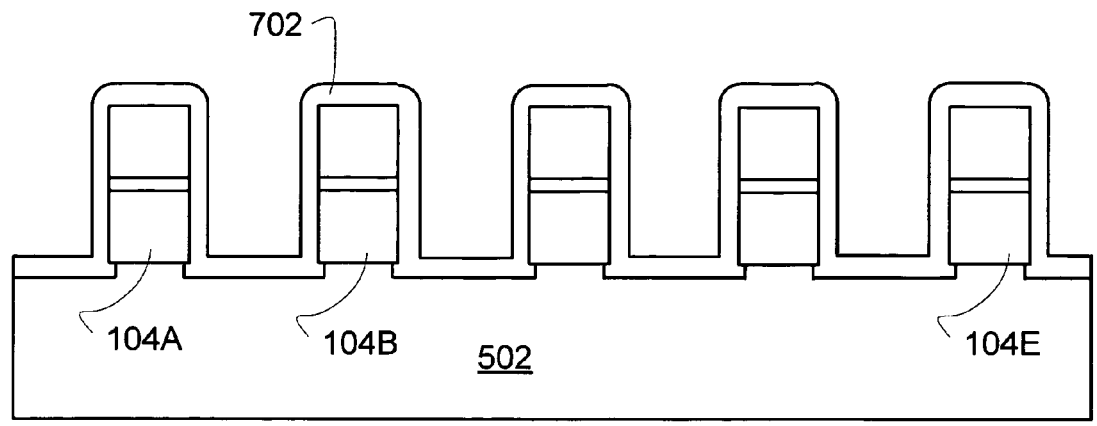
FIG. 7 is a cross-sectional side view that illustrates the circuit after formation of a spacer layer on the diffusions.

FIG. 7 is a cross-sectional side view, taken through line A—A of FIG. 2, that illustrates the circuit 100 after formation of a spacer layer 702 on the diffusions 104, pad oxide layer 506, and hardmask 508, according to one embodiment. The spacer layer 702 may comprise a silicon oxide material in one embodiment, although in other embodiments the spacer layer 702 may comprise other materials or a combination of different materials such as silicon oxide and silicon nitride. The material of the spacer layer 702 may be selected to allow selective etches of the hard mask layer 508, spacer layer 702, and isolations 110 at various steps of formation of the circuit 100. For example, on one embodiment, the semiconductor layer 504 may comprise single crystal silicon, the mask layer 508 may comprise of SiON on polysilicon, the spacer layer 702 material may comprise silicon oxide, and the isolations 110 may comprise silicon nitride. The thickness of the spacer layer 702 may be chosen based on a desired width 112 of an insulating isolation structure 110 (which may in turn be chosen based upon a desired distance between gates 106) and space required to add material around the diffusion 104 (see FIGS. 10 and 11 and their descriptions, below).

Figure 8:
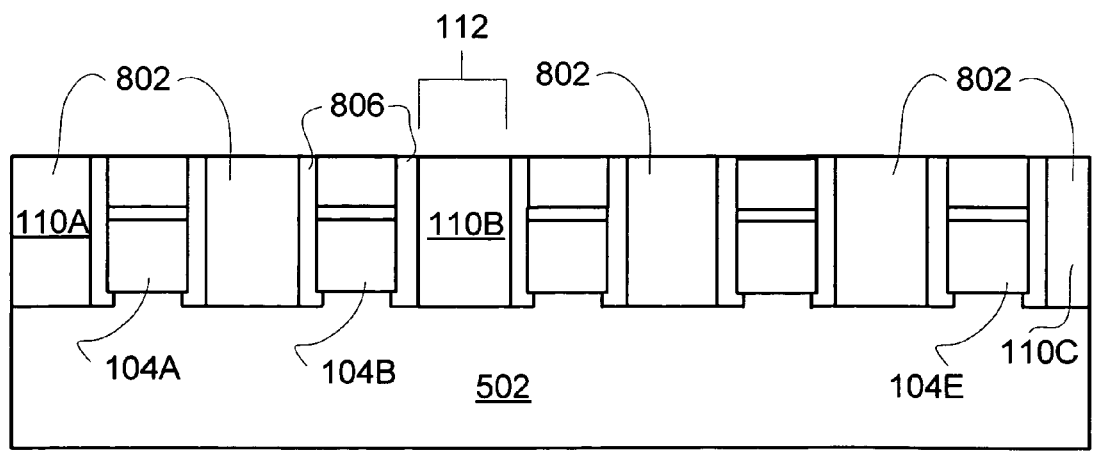
FIG. 8 is a cross-sectional side view that illustrates the circuit after the spacer layer has been etched to form spacers.

FIG. 8 is a cross-sectional side view, taken through line A—A of FIG. 2, that illustrates the circuit 100 after the spacer layer 702 has been etched to form spacers 806, according to one embodiment. Portions of the spacer layer 702 may be removed (by etching, etc.) to form the spacers 806. The distance between two spacers 806 at the conclusion of the removal operation may determine the width 112 of an insulating isolation structure 110 formed between the two spacers 806, according to one embodiment. A layer of an insulating material 802 may then be deposited to substantially fill the volumes between spacers 806. In an embodiment, the insulating material 802 may comprise silicon nitride, although other materials may be used in other embodiments. The layer of insulating material 802 and other material may then be planarized to form a substantially planar surface of insulating material 802 portions, spacers 806, and the remaining portions of the hardmask 508. In one embodiment, rather than etching away a portion of the spacer layer 702 to form the spacers 806, the spacer layer 702 on top of hardmask 508 may be polished away during the planarization of insulating materials 802 to form the spacers 806. A layer of material of spacer layer 702 may remain between insulating material 802 and buried oxide 502. Such a structure may be suitable for planar device applications.

Portions of the insulating material 802 may be used as the insulating isolation structures 110. The insulating isolation structures 110 are thus self-aligned to the diffusions 104. As seen in FIG. 8, the width 112 of the insulating isolation structure 110B may be defined by the distance between two adjacent spacers 806. This width 112 may define the distance between two adjacent gates 106, such as the distance 112 between adjacent gates 106A and 106B of FIG. 2. Thus, in some embodiments the distance 112 between gates 106 may not depend on the lithography alignment accuracy but rather be pre-defined by the distance between diffusions 104A and 104B, and the thickness of the spacer layer 702.

Figure 9:
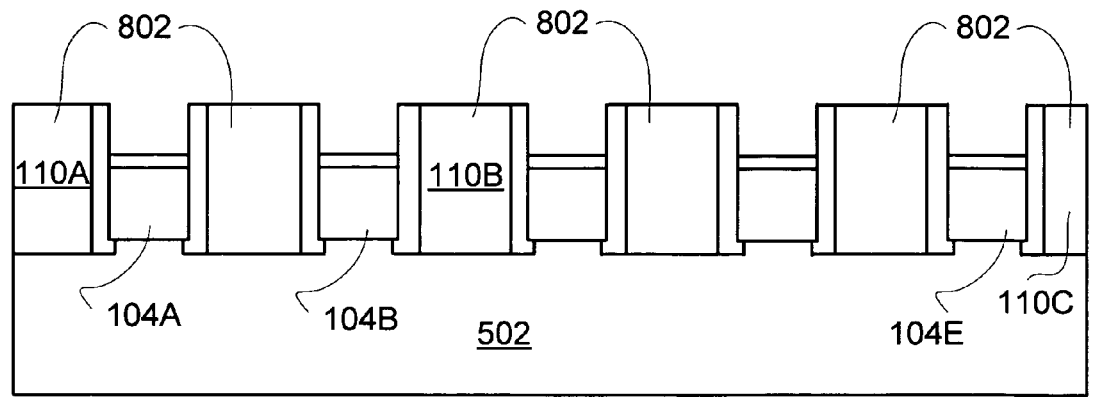
FIG. 9 is a cross-sectional side view that illustrates the circuit after removal of the remaining portions of the hardmask layer.

FIG. 9 is a cross-sectional side view, taken through line A—A of FIG. 2, that illustrates the circuit 100 after removal of the remaining portions of the hardmask layer 508. In an embodiment, the material of the hardmask layer 508, the insulating material layer 802 and the spacer layer 702 may be chosen so that when the hardmask layer 508 is removed, the other materials are relatively unaffected by the removal process. As stated above, the materials for hard mask layer 508, spacers 806, and isolations 110 may allow for selective etches. In one embodiment, the semiconductor layer 504 may comprise single crystal silicon, the mask layer 508 may comprise SiON on polysilicon (note that while mask layer 508 is shown as one layer in the Figures, it may comprise multiple layers of materials in some embodiments), the spacer 806 may comprise silicon oxide, and the insulating material 802 and isolations 110 may comprise silicon nitride. The SiON portion of the mask layer 508 may be thin enough so that the underlying polysilicon may be exposed after the planarization of the insulator layer 802; the SiON in such an embodiment is thin enough to be substantially removed by the planarization process. The polysilicon may then be removed by a wet etch selectively against the silicon oxide spacer 806 and silicon nitride insulating layer 802, leaving the spacer 806 and insulating layer 802 in place. The single crystal silicon 504 of some embodiments may be protected by the silicon pad oxide layer 506 and spacer 806 in some embodiments. In other embodiments, different material combinations may be used.

Figure 10:
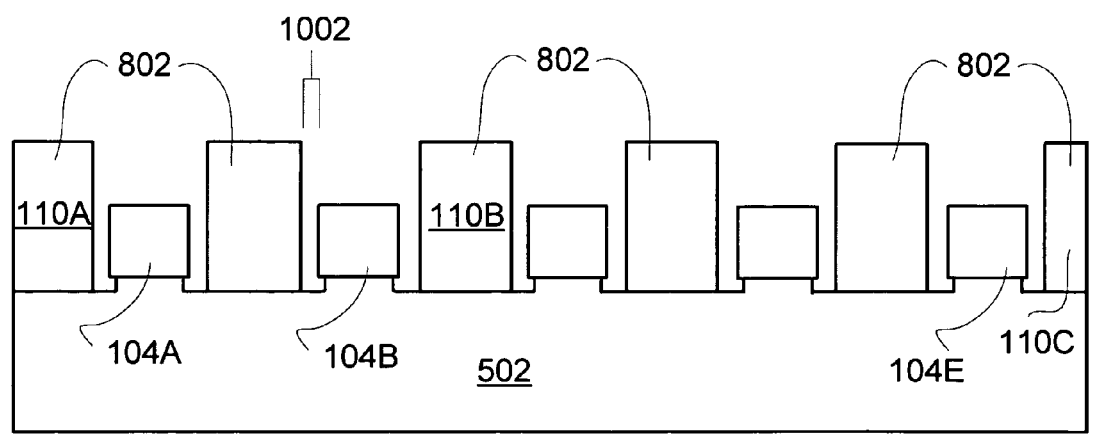
FIG. 10 is a cross-sectional side view that illustrates the circuit after removal of the spacers and pad oxide layer to expose the diffusions.

FIG. 10 is a cross-sectional side view, taken through line A—A of FIG. 2, that illustrates the circuit 100 after removal of the spacers 806 and pad oxide layer 506 to expose the diffusions 104, according to one embodiment. In the illustrated embodiment, the transistors formed may be tri-gate transistors, with a gate 106 on each of the three exposed sides of the diffusion 104. In other embodiments, other types of transistors may be formed. To form a tri-gate transistor gate 106, the distance 1002 between the diffusion 104 and the insulating material 802 may be selected to be large enough to deposit material therebetween. In some embodiments, the distance 1002 may be determined by the thickness of layer 702, which can be very precisely controlled.

Figure 11:
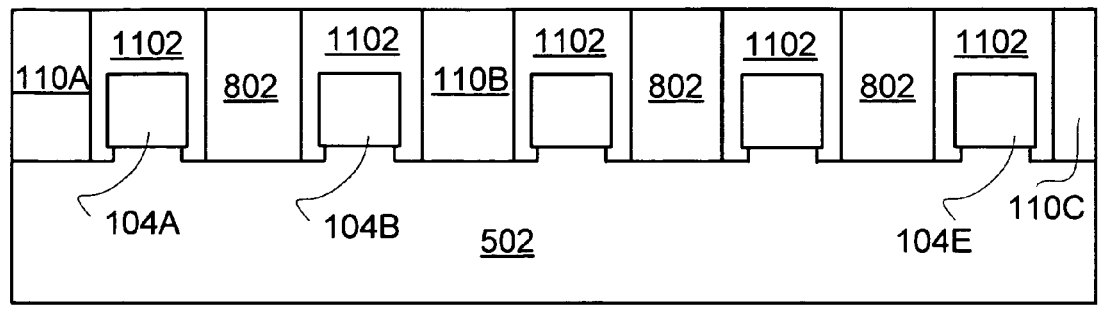
FIG. 11 is a cross-sectional side view that illustrates the circuit after deposition of polysilicon.

FIG. 11 is a cross-sectional side view, taken through line A—A of FIG. 2, that illustrates the circuit 100 after the deposition and planarization of a first gate material 1102, according to one embodiment. The first gate material 1102 may be polysilicon, metal or other materials deposited after the deposition of gate dielectric (not shown). In one embodiment, the first gate material 1102 may be a placement holder for replacement gate process where the first gate material 1102 is removed and a final metal gate and gate dielectric replace the place-holder first gate material 1102. In another embodiment, the first gate material 1102 may be used as the material of the gate in the final transistor. The first gate material 1102 may be planarized to be substantially coplanar with the top of the insulating material 802 and insulating isolation structures 110, as illustrated in FIG. 11. The current self-aligned process is compatible with a CMOS process using two different types of metal gates for the N- and P-MOS devices. A practitioner of the art will be able to incorporate the dual metal processes of CMOS with the current self-aligned process.

Figure 12A:
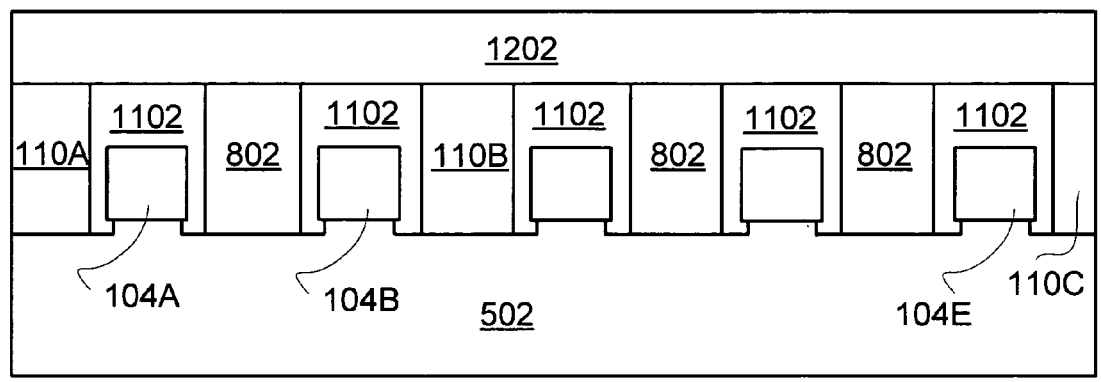
FIGS. 12a and 12b illustrate the circuit after deposition and patterning of a second hardmask layer.
Figure 12B:
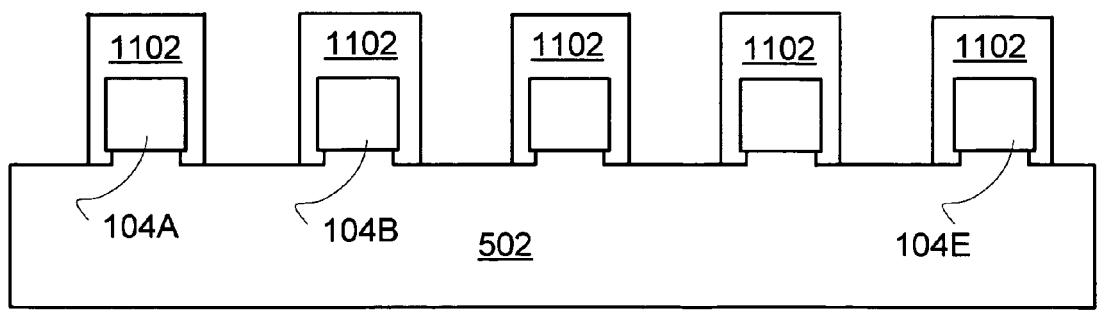
Figure 13:
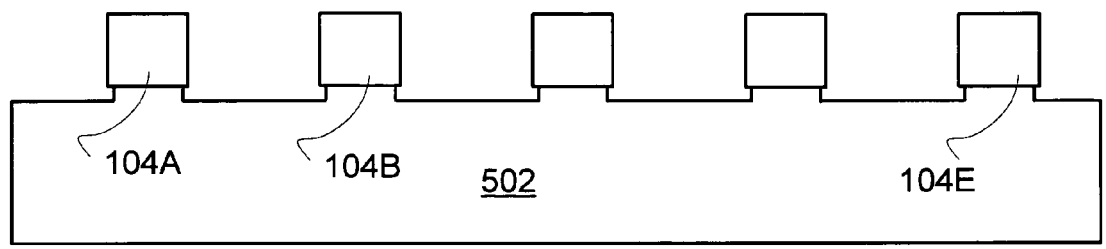
FIG. 13 is a cross-sectional side view that illustrates the circuit after removal of portions of the polysilicon.

FIG. 12a is a cross-sectional side view, taken through line A—A of FIG. 2, that illustrates the circuit 100 after deposition and patterning of a second hardmask layer 1202, according to one embodiment. This hardmask layer 1202 may be patterned to expose portions of the insulating material 802 and first gate material 1102 that is to be removed. FIG. 12b is a cross-sectional side view, taken through line B—B of FIG. 2, that illustrates the circuit 100 after removal of hardmask layer 1202 and portions of the insulating material 802 from regions of the circuit 100. As seen in FIGS. 12a and 12b the hardmask layer 1202 may be patterned to remain in place over the area in which gates 106 will be formed (FIG. 12a), and removed elsewhere (FIG. 12b). The insulating material 802 may then be removed from areas not protected by the patterned hardmask layer 1202 using a suitable etching process. During the removal of insulating material 802, the diffusion may be protected by the first gate material 1102. In one embodiment, the insulating material 802 may be silicon nitride and the first gate material 1102 may be polysilicon, which can be etched with very high selectivity against gate dielectric (not shown) to complete the gate definition. As seen in FIG. 13, which is a cross-sectional side view, taken through line B—B of FIG. 2, first gate material 1102 may be removed from areas not protected by the patterned hardmask layer 1202 using a suitable etching process, which may stop at the gate dielectric that may protect the diffusions 104.

Figure 14A:
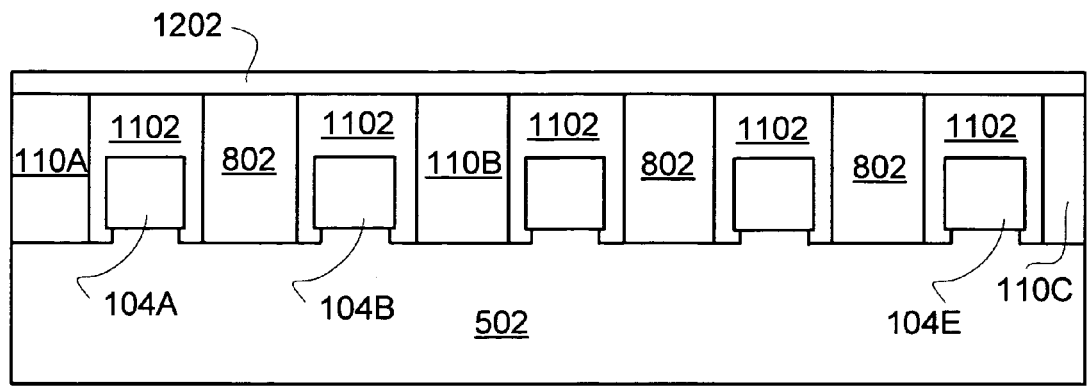
FIGS. 14a, 14b, and 14c illustrate the circuit after the formation of spacers, implantation of dopants into the exposed portions of the diffusions, and formation of silicide areas.
Figure 14B:
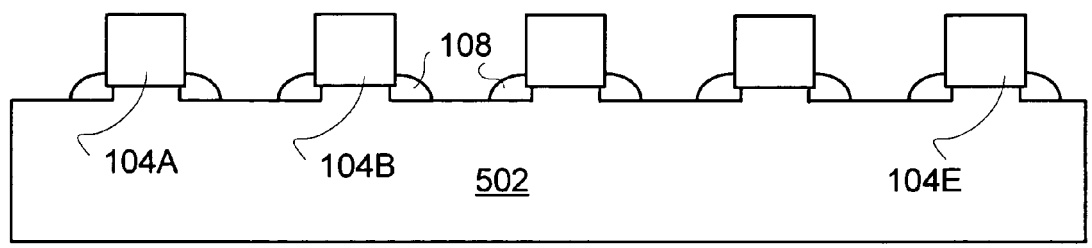
Figure 14C:
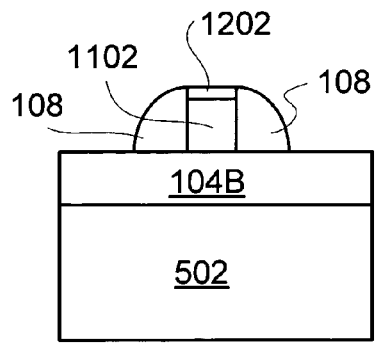

FIG. 14a is a cross-sectional side view, taken through line A—A of FIG. 2, that illustrates the circuit 100 after the formation of spacers 108, implantation of dopants into the exposed portions of the diffusions 104, and formation of silicide areas, according to an embodiment. Some embodiments of the current invention are compatible with various CMOS processes. For example, transistor performance enhancement techniques, such as the epitaxial growth of silicon for forming raised source/drain structures or strained silicon, can be applied prior to silicidation. As seen in FIG. 14a, the hardmask layer 1202 may substantially protect the areas in which gates 106 will be formed, although the various processes used may thin the hardmask layer 1202. FIG. 14b is a cross-sectional side view, taken through line B—B of FIG. 2, that illustrates the circuit 100 at the same stage of fabrication as FIG. 14a. As seen in FIG. 14b, the spacers 108 have been formed around the diffusions. The spacers 108 can be formed around the gates as shown in FIG. 14c, which is a cross-sectional side view taken through line C—C of FIG. 2 at the same stage of fabrication as FIG. 14a. As illustrated in FIG. 14c, a portion of the first gate material 1102 may remain on the diffusion 104 since the first gate material 1102 may be protected by the hardmask layer 1202. The spacers 108 may be on either side of the first gate material 1102. In one embodiment, the hardmask layer 1202 may be removed by overetching spacer layer 108 or by another process prior to silicidation, so that the gate can be silicided as well. A silicided poly gate may utilize a subtractive process for forming a gate as described below in [0064]–[0067].

After silicidation, in one embodiment, nitride etch stop may be deposited post spacer 108 formation. An ILD layer may then be deposited and planarized for contact, interconnect or replacement gate process. In one embodiment the transistor is made by a replacement gate process as further illustrated in FIGS. 15 through 18.

FIG. 15a is a cross-sectional side view, taken through line A—A of FIG. 2, that illustrates the circuit 100 after a masking layer 1502 is patterned on a layer 1504 of interlayer dielectric (ILD) that has been deposited and planarized. In the embodiment illustrated in FIG. 15a the remaining portions of the hardmask layer 1202 have been removed. FIGS. 15b, 15c, and 15d are cross-sectional side views that illustrate the circuit 100 at the same stage of fabrication through lines B—B, C—C, and D—D of FIG. 2, respectively. An ILD layer 1504 may be deposited and planarized so the top of the ILD layer 1504 may be substantially planar with the top of the remaining insulating material 802 and first gate material 1102. The remaining hardmask layer 1202 may be removed during the planarization of ILD layer 1504.

A masking layer 1502 may be deposited and patterned. In some embodiments, the masking layer 1502 may comprise photoresist, while in other embodiments the masking layer 1502 may comprise a patterned oxide layer, and in still other embodiments the masking layer may comprise other materials. The patterned masking layer 1502 may leave exposed some of the remaining portions of the insulating material 802, while protecting portions of the insulating material 802 that are the insulating isolation structures 110.

Openings in patterned mask layer 1502 may be relatively large compared to the gate lengths, and relatively large compared to the extent of the insulating material 802 to be removed. Such relatively large openings may compensate for possible alignment errors. For example, FIG. 15a illustrates an embodiment where portions of the first gate material 1102 are exposed by the opening in the patterned mask layer 1502 on either side of the insulating material 802 to be removed; this may allow alignment errors to occur while still exposing the insulating material 802 to be removed.

Figure 16A:
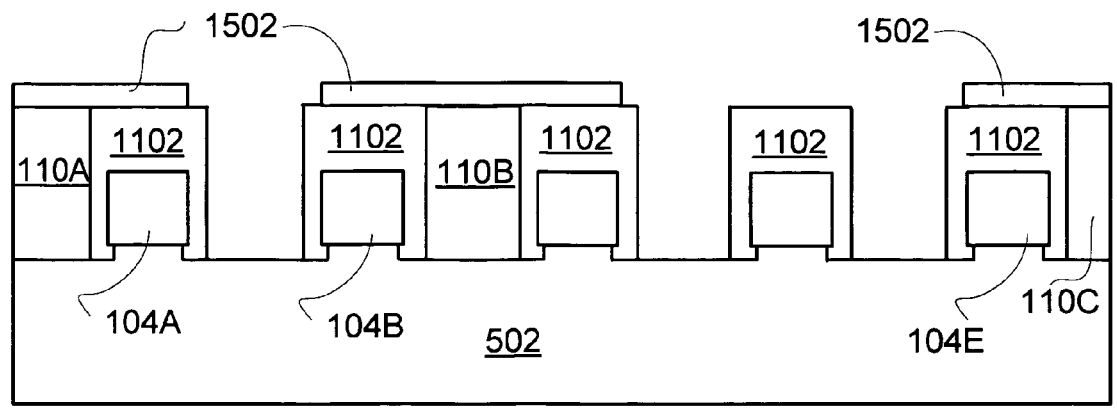
FIGS. 16a and 16d illustrate the circuit after removal of exposed portions of the insulating material.

FIG. 16a is a cross-sectional side view, taken through line A—A of FIG. 2, that illustrates the circuit 100 after selective removal of exposed portions of the insulating material 802, according to one embodiment. In an embodiment, hot phosphoric acid may be used to selectively etch away portions of the insulating material 802 (which may comprise silicon nitride), leaving the mask layer 1502 (which may comprise silicon oxide), spacers 108 (which may comprise carbon-doped silicon nitride), and the first gate material 1102 (which may comprise polysilicon). In an embodiment, the portions of the insulating material 802 remaining at this point may be the portions that are the insulating isolation structures 110.

Figure 16D:
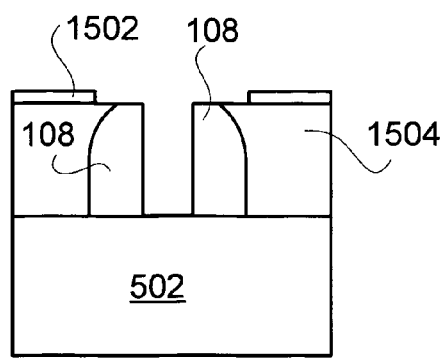

The portions of the insulating material 802 may be removed to allow formation of interconnects among the gates 106 that will be formed. As illustrated in FIG. 16d, which is a cross-sectional view through lines D—D of FIG. 2, the spacers 108 may at least partially define a volume within which the gate interconnects may be formed. At this stage, cross sectional side views through lines B—B and C—C of FIG. 2 may remain substantially unchanged from FIG. 15b and 15c, as the masking layer 1502 may protect these areas.

Figure 17A:
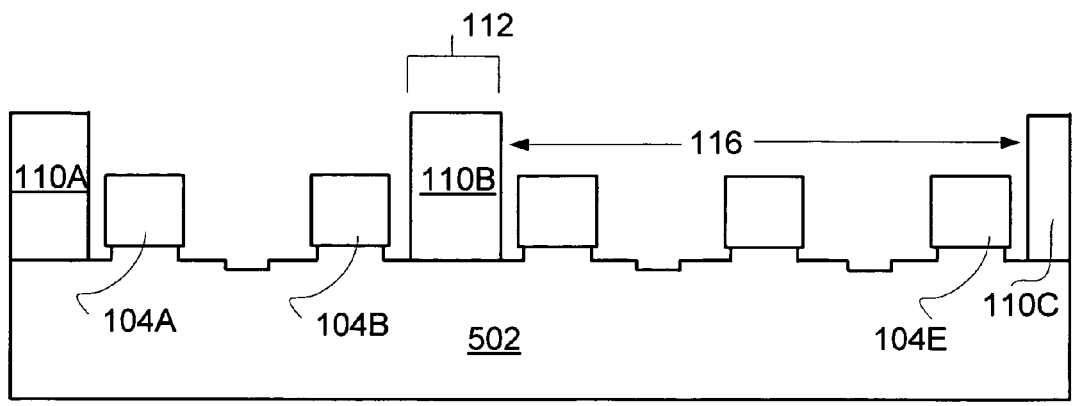
FIGS. 17a–17d illustrate the circuit after removal of polysilicon around the diffusions.
Figure 17B:
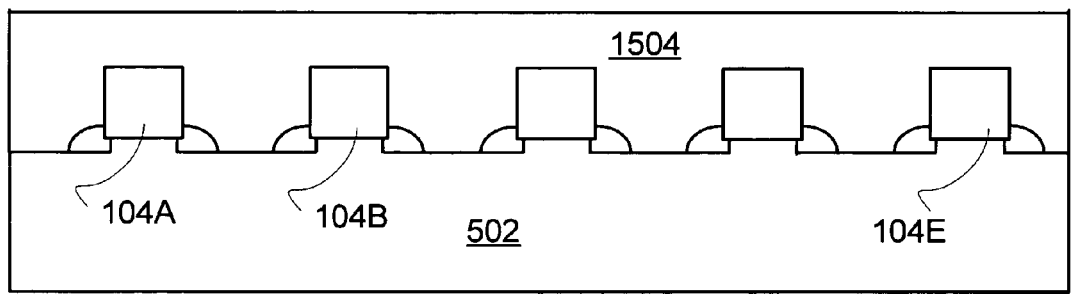
Figures 17C, 17D:
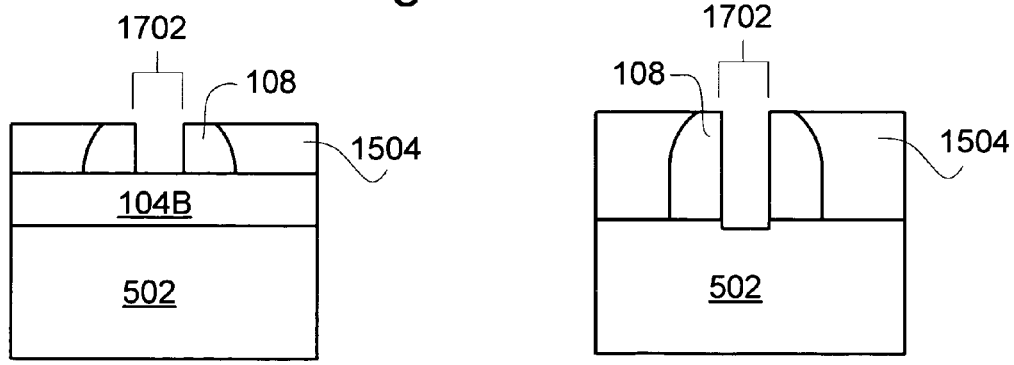

FIG. 17a is a cross-sectional side view, taken through line A—A of FIG. 2, that illustrates the circuit 100 after removal of first gate material 1102 around the diffusions 104, according to one embodiment. FIGS. 17b, 17c, and 17d are cross-sectional side views that illustrate the circuit 100 at the same stage of fabrication through lines B—B, C—C, and D—D of FIG. 2, respectively. In an embodiment, the patterned masking layer 1502 may be first removed, then an etch process selective to the polysilicon 1102 may be used to remove the polysilicon 1102. As illustrated in FIG. 17a, a volume within which the gates 106 may be formed has been defined. The widths of the gates 106 may be defined by the separation between adjacent insulating isolation structures 110, such as the width 116 being defined by the separation between insulating isolation structures 110B and 110C. The distance between two adjacent gates 106 may be defined by the width 112 of the insulating isolation structures 110. The length of the gates 106 may be defined by the distance 1702 between the two spacers 108.

FIG. 18a is a cross-sectional side view, taken through line A—A of FIG. 2, that illustrates the circuit 100 after formation of the gates 106 and a second ILD layer 1804 and contacts 118, according to one embodiment. FIGS. 18b, 18c, and 18d are cross-sectional side views that illustrate the circuit 100 at the same stage of fabrication through lines B—B, C—C, and D—D of FIG. 2, respectively. Because a volume in which the gates 106 may be formed may have been pre-defined, the gates 106 may be self-aligned. This self-aligned gate formation process may allow the diffusions 104 to be placed closer together than if alignment errors need be taken into account for gate placement. The self-alignment method may allow for a set desired endcap width 115 without the need for planning for a margin of error provided by an alignment process. Rather, the width of the endcap 115 may be determined by the width of spacers 806, which may in turn be determined by the thickness of spacer layer 702. Any suitable method may be used for depositing the second gate material that forms the gates 106. After deposition, the second gate material may be planarized to have a top surface substantially level with the top surfaces of the insulating isolation structures 110. The second ILD layer 1804 may then be formed, and contacts 118 to the gates 106 and contacts 120 to the diffusions 104 formed through the ILD layer 1804 or layers 1804 and 1504. Additional ILD layers, traces and vias may be formed to finish the circuit 100.

As shown in the embodiment illustrated in FIG. 18a, the contact 118 to gate 106A may be laid on top of a dummy diffusion 104A and the contact 118 to gate 106B on a dummy diffusion 104E. The contacts 118 may be offset from active diffusions 104B, 104C, and 104D, in some embodiments to prevent shorts to the diffusion contacts to the source and/or drain. In some embodiments the dummy diffusion may also be used to form isolations 110A and 110C to avoid shorting with the gates of neighboring devices to the left and to the right (not shown in FIG. 18a). In other embodiments where there is no neighboring device or the gates of neighboring devices are to be connected, such dummy diffusions may be omitted.

As illustrated in the embodiment shown in FIG. 18a, second gate material that forms gate 106 actually may form more a gate as well as an interconnection between the gate and a contact to that gate (as shown with gate 106A). The second gate material that forms gate 106A forms an active gate around active diffusion 104B and also forms an interconnection to dummy diffusion 104A, on which the gate contact 118 is formed. Thus, gate 106A as used herein encompasses more than just the actual active gate around active diffusion 104B; it encompasses the interconnect as well.

Similarly, second gate material that forms a gate 106 actually may form more than one active gate as well as an interconnection between those gates (as shown with gate 106B). The second gate material that forms gate 106B forms two active gates around active diffusions 104C and 104D, as well as an interconnection between the two active gates, in addition to an interconnection to dummy diffusion 104E, on which the gate contact 118 is formed. Thus, gate 106B as used herein encompasses more than just a single active gate around a single active diffusion; it encompasses two active gates around two active diffusions 104C and 104D and interconnects as well.

Figure 19:
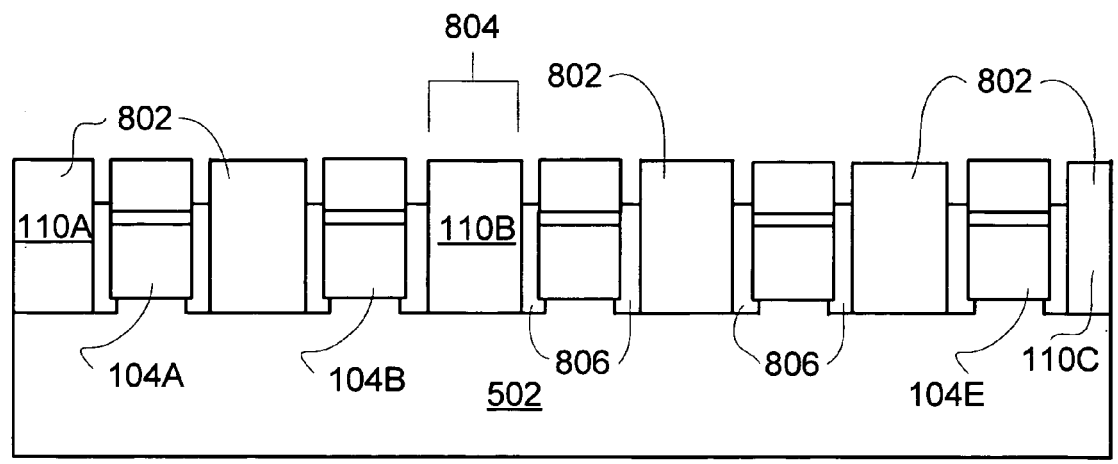
FIG. 19 is a cross-sectional side view that illustrates the circuit at a stage in fabrication of planar transistors.

While a method of making a circuit 100 with a self-aligned gate 106 has been described above with respect to a tri-gate transistor, self-aligned gates may be used in other types of transistors as well, such as a planar transistor. FIG. 19 is a cross-sectional side view, taken through line A—A of FIG. 2, that illustrates the circuit 100 at a stage in fabrication of planar transistors, rather than tri-gate transistors, according to one embodiment. Similar processes to those described with respect to FIGS. 4 through 8 may be performed. Then, a portion of spacers 806 may be removed in such a way that it will end up at the same level as the diffusion 104 at the end of the gate oxide deposition. In one embodiment, spacer 806 may comprise silicon oxide and hydrofluoric acid may be used to remove the spacer 806 without etching other materials in the structure. In this embodiment, the spacer 806 may be partially removed to a level above the top of pad oxide 506 (shown in FIG. 6). If there is enough thickness left in spacer 806 above the top of the pad oxide 506, the top of the spacer layer 806 may be brought down to the same level of the diffusion 104 after various oxide removal process such as pad oxide removal, sacrificial oxide removal and gate oxide preclean.

Figure 20:
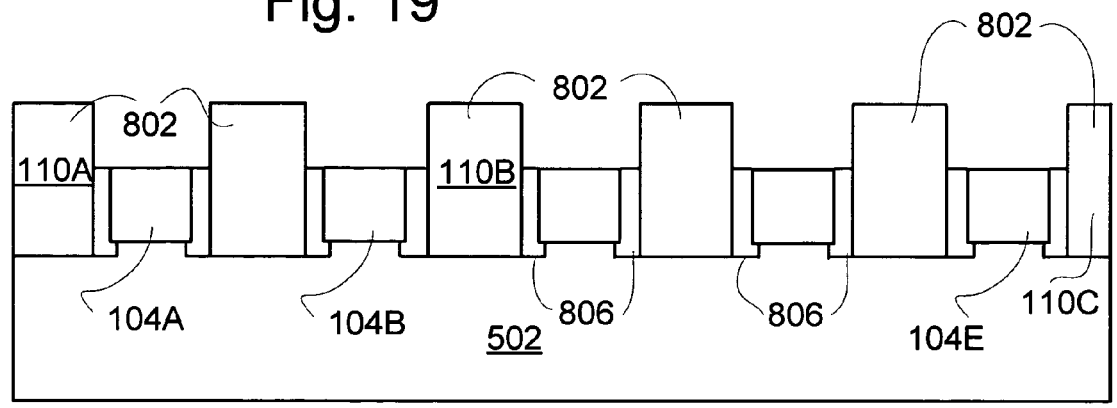
FIG. 20 is a cross-sectional side view that illustrates the circuit after removal of the remaining portions of the hardmask layer.

FIG. 20 is a cross-sectional side view, taken through line A—A of FIG. 2, that illustrates the circuit 100 of FIG. 19 after removal of the remaining portions of the hardmask layer 508. In an embodiment, the material of the hardmask layer 508, the insulating material layer 802 and the spacer layer 702 may be chosen so that when the hardmask layer 508 is removed, the other materials are relatively unaffected by the removal process. In one embodiment, the materials for hard mask layer 508, spacers 806, and isolations 110 may allow for selective etches. In one embodiment, the semiconductor layer 504 (portions of which may become diffusions 104) may comprise single crystal silicon, the mask layer 508 may comprise SiON on polysilicon, the spacer 806 may comprise silicon oxide, and the isolations 110 may comprise silicon nitride.

Figure 21:
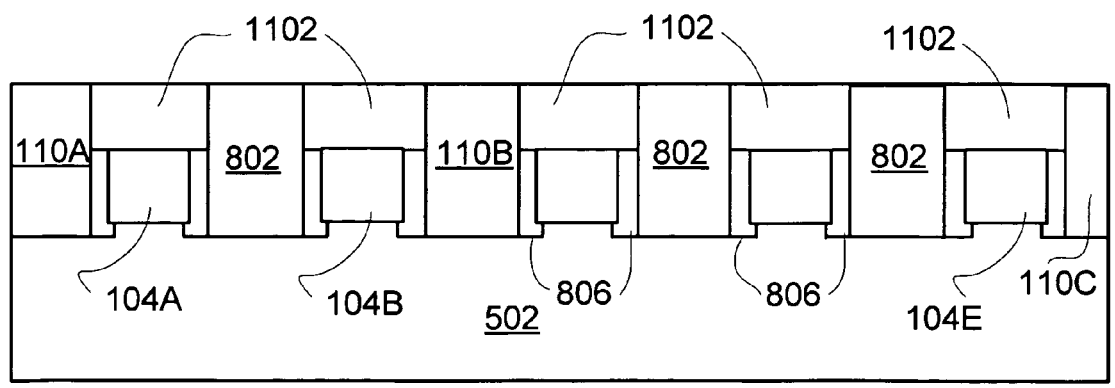
FIG. 21 is a cross-sectional side view that illustrates the circuit after deposition of polysilicon.

FIG. 21 is a cross-sectional side view, taken through line A—A of FIG. 2, that illustrates the circuit 100 of FIG. 20 after deposition and planarization of first gate material 1102, which may comprise polysilicon according to one embodiment, although in other embodiments the first gate material 1102 may comprise other materials. The first gate material 1102 may be planarized to be substantially coplanar with the top of the insulating material 802 and insulating isolation structures 110, as illustrated in FIG. 11. In some embodiments the first gate material 1102 need not be deposited between the diffusions 104 and the insulating material 802. Because portions of the spacers 806 remain in place, the first gate material 1102 may only need to be deposited down to the level of the top of the spacers 806 and diffusions 104. Thus, the thickness of the spacer layer 702 (as described above with respect to FIG. 7) may be selected to be less in a planar transistor than when fabricating a tri-gate transistor. Other process steps, which may be similar to those described with respect to a tri-gate transistor, may be performed to finish the planar transistor with a self-aligned gate 106.

Gates self-aligned to diffusions in a tri-gate transistor may also be part of a metal gate transistor formed using a subtractive process, rather than a replacement gate process. For a subtractive process, the method described above through FIG. 10 may be used.

Figure 22:
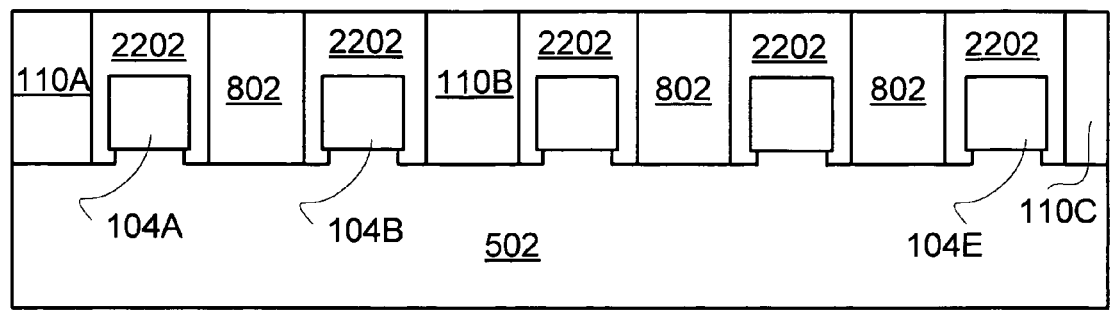
FIG. 22 is a cross-sectional side view that illustrates the circuit after deposition and planarization of a first gate material when making a transistor using a subtractive method.

FIG. 22 is a cross-sectional side view, taken through line A—A of FIG. 2, that illustrates the circuit 100 of FIG. 10 after deposition and planarization of a first gate material 2202. In the replacement gate method described above, the first gate material 1102 is removed and replaced with second gate material that forms the gates 106. In contrast, with the described subtractive process embodiment, the first gate material 2202 forms the gates 106 when the transistor is complete. In an embodiment, gate dielectric material (not shown) may be conformally deposited around the diffusions 104 and insulating material 802 of FIG. 10 prior to deposition of the first gate material 2202. The gate dielectric may comprise a layer of silicon dioxide or other relatively low-k (low dielectric constant) material and a layer of high-k dielectric material on the silicon dioxide, in an embodiment, although other suitable materials may be used. There may be a layer of barrier and/or workfunction material (not shown) on the gate dielectric in some embodiments. After deposition of the dielectric material, barrier, and/or workfunction material, the first gate material 2202 may be deposited and planarized. The first gate material 2202 may comprise Au, TiN, or another suitable material.

Figure 23:
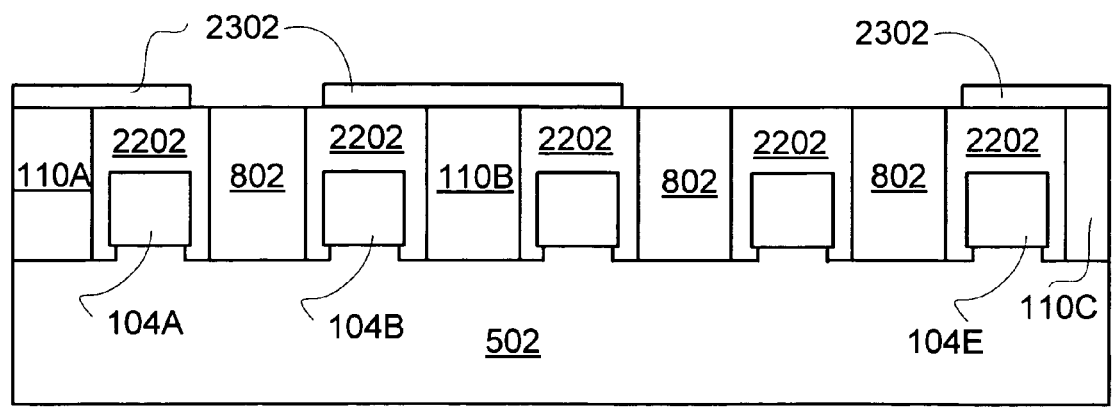
FIG. 23 is a cross-sectional side view that illustrates the circuit after deposition and patterning of a mask layer.

FIG. 23 is a cross-sectional side view, taken through line A—A of FIG. 2, that illustrates the circuit 100 of FIG. 22 after deposition and patterning of a mask layer 2302. Openings in the mask layer 2302 may be formed to allow removal of portions of the insulating material 802 (which may comprise silicon nitride) while protecting isolation structures 110 from being removed.

Figure 24:
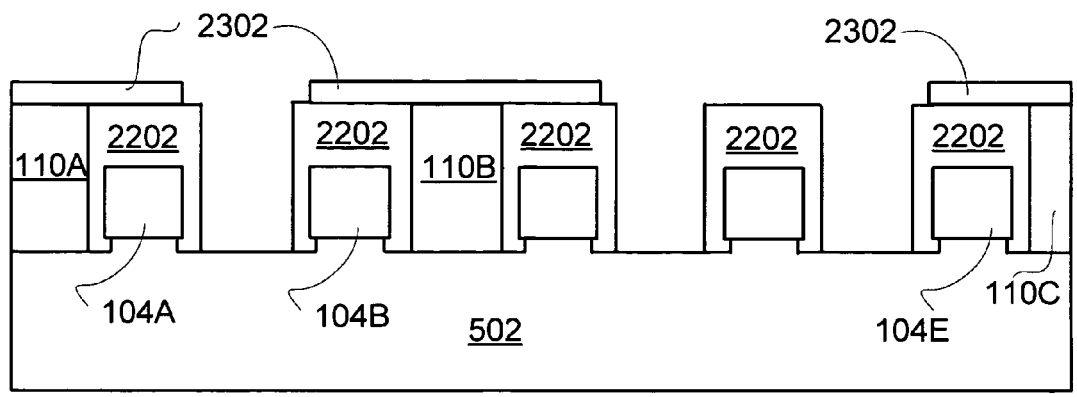
FIG. 24 is a cross-sectional side view that illustrates the circuit after removal of portions of the insulating material.

FIG. 24 is a cross-sectional side view, taken through line A—A of FIG. 2, that illustrates the circuit 100 of FIG. 23 after removal of portions of the insulating material 802 (which may comprise silicon nitride). One or more wet etches that selectively remove the portions of insulating material 802 and gate dielectric (on the sidewalls of gate 2202) while leaving the first gate material 2202 (which become the gates 106) intact may be used. Note that a gate dielectric layer (not shown in the figures) may be formed prior to formation of gate material 2202; such formation of the gate dielectric layer may result in the gate dielectric material being formed on sides of insulating material 802 as well as on the surfaces of the diffusions 104.

Figure 25:
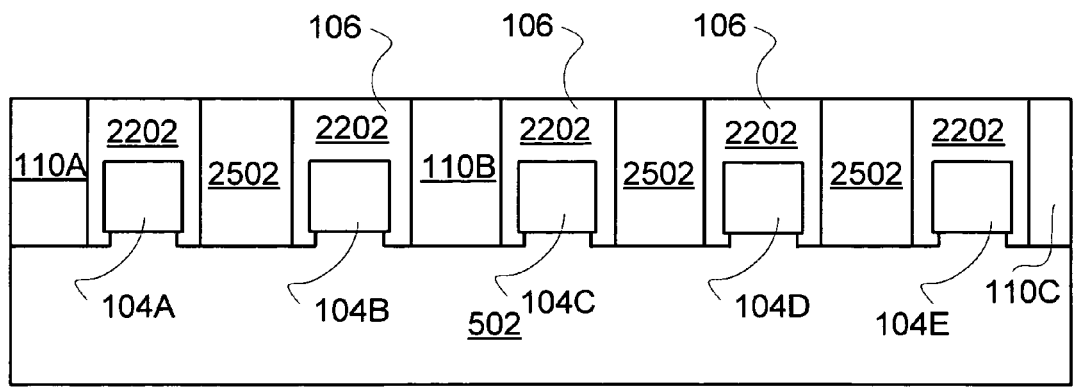
FIG. 25 is a cross-sectional side view that illustrates the circuit after conductive material has been deposited and planarized.

FIG. 25 is a cross-sectional side view, taken through line A—A of FIG. 2, that illustrates the circuit 100 of FIG. 24 after conductive material 2502 has been deposited and planarized. The conductive material 2502 may comprise a metal or other suitable conductive material. The conductive material 2502 may electrically connect the gates 106 around the various diffusions 104 and/or connect a gate around an active diffusion 104 to a contact formed above a dummy diffusion 104 (similar to that shown in FIG. 18*a*). Thus, the first gate material 2202 around active diffusions 104B, 104C, and 104D may form active gates 106, while the first gate material 2202 and conductive material 2502 may form interconnections between active gates 106 and between an active gate 106 and a dummy gate around a dummy diffusion 104A, 104E, on which a gate contact 118 may be formed. Thereafter, transistors may be finished (by ion implantation and/or other steps) and ILD layers contacts, traces, and other structures may be formed to complete the circuit, as described above with respect to the replacement gate process.

Figure 26:
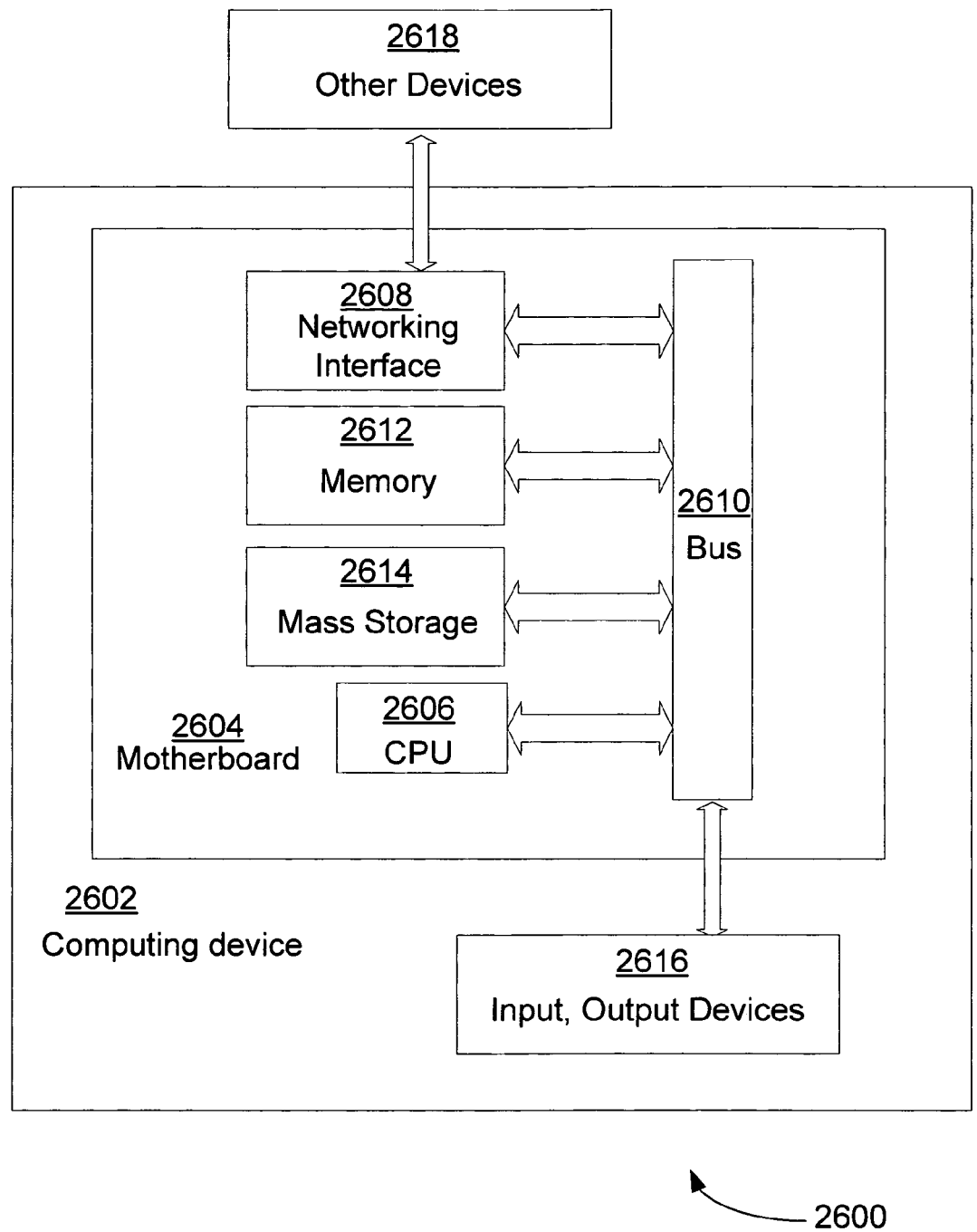
FIG. 26 is a block diagram that illustrates a system in accordance with one embodiment of the present invention.

FIG. 26 is a block diagram that illustrates a system 2600 in accordance with one embodiment of the present invention. As illustrated, for the embodiment, system 2600 includes a computing device 2602 for processing data. Computing device 2602 may include a motherboard 2604. Motherboard 2604 may include in particular a processor 2606, and a networking interface 2608 coupled to a bus 2610. The networking interface 2608 may connect the computing device 2602 to other devices 2608, such as other computing devices 2602.

Depending on the applications, system 2600 may include other components, including but are not limited to volatile and non-volatile memory 2612, a graphics processor (which may be integrated with a motherboard along with a chipset, or alternatively may be an expansion card, such as AGP, PCI Express or other type, removably inserted into a socket on a motherboard, or another type of graphics processor), a digital signal processor, a crypto processor, a chipset, mass storage 2614 (such as hard disk, compact disk (CD), digital versatile disk (DVD) and so forth), input and/or output devices 2616, and so forth.

In various embodiments, system 2600 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

One or more of the circuits 100 including transistors with self-aligned gates as described above may be included in the system 2600 of FIG. 26 as part of any one of a number of components. For example, the circuit 100 may be part of the CPU 2606, memory 2612, or other devices.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

I claim:

1. A method, comprising:
 forming a first diffusion on a substrate;
 forming a second diffusion on the substrate a distance from the first diffusion;
 forming an insulating isolation structure on the substrate between the first and second diffusions, the insulating isolation structure being self-aligned to the first and second diffusions wherein forming the insulating isolation structure comprises:
  depositing a spacer layer on the first and second diffusions, the spacer layer defining a trench between the first and second diffusions; and
  depositing insulating material in the trench to form the insulating isolation structure; and
 forming, after forming the insulating isolation structure, a first transistor gate on the first diffusion and a second transistor gate on the second diffusion, the insulating isolation structure defining a separation distance between the first and second transistor gates.

2. The method of claim 1, further comprising removing at least a portion of the spacer layer after forming the insulating isolation structure.

3. The method of claim 2 wherein removing at least a portion of the spacer layer results in exposing side walls of the first and second diffusions, further comprising depositing gate material on side walls of the first and second diffusions between each of the first and second diffusions and the insulating isolation structure.

4. The method of claim 3, wherein the first transistor gate and the first diffusion are part of a tri-gate transistor.

5. The method of claim 2, wherein removing at least a portion of the spacer layer comprises removing a portion of the spacer layer to a level about equal to a top surface of the first diffusion.

6. The method of claim 5, wherein the first transistor gate and the first diffusion are part of a planar transistor.

7. The method of claim 1, wherein the insulating isolation structure comprises silicon nitride.

8. The method of claim 1, wherein the first transistor gate has a top surface, the insulating isolation structure has a top surface, and the top surface of the first transistor gate is substantially coplanar with the top surface of the insulating isolation structure.

9. A method, comprising:
 forming a first diffusion on a substrate;
 forming a first spacer layer on the first diffusion;
 forming a first insulating isolation structure on the substrate to a first side of the first diffusion, a distance between the insulating isolation structure and the first diffusion being defined by a thickness of the first spacer layer; and
 forming a gate on the first diffusion, the gate having an endcap with a width defined by the distance between the insulating isolation structure and the first diffusion.

10. The method of claim 9, further comprising:
 forming a second insulating isolation structure on the substrate to a second side of the first diffusion opposite the first side;
 forming a first spacer on a first portion of the first diffusion and a second spacer on a second portion of the first diffusion, wherein a third portion of the first diffusion between the first and second portions is not covered by the first or second spacers; and
 forming a gate on the first diffusion within a volume at least partially defined by the first and second isolation structures and the first and second spacers.

11. The method of claim 10, wherein a distance between the first and second spacers provides a predefined length of the gate.

12. The method of claim 9, wherein a distance between the first and second insulating isolation structures provides a predefined width of the gate.

13. The method of claim 9, wherein forming the first insulating isolation structure comprises:
 forming a second diffusion on the substrate to the first side of the first diffusion;
 depositing the first spacer layer on the first diffusion and on the second diffusion; and
 depositing insulating material in a trench between the first spacer layer on the first diffusion and the first spacer layer on the second diffusion to form the first insulating isolation structure.

14. A device, comprising:
 a first diffusion on a substrate;
 a second diffusion on the substrate;
 a first gate on the first diffusion;
 a second gate on the second diffusion;
 an insulating isolation structure between the first and second gates that separates and insulates the first and second gates from each other; and
 wherein the first gate has an endcap between the first diffusion and the insulating isolation structure, the second gate has an endcap between the second diffusion and the insulating isolation structure, and the first endcap has a width about equal to a width of the second endcap.

15. The device of claim 14, further comprising spacers on either side of the first gate, wherein the first and second diffusions comprises single crystal silicon, the spacers comprise carbon doped silicon nitride, and the insulating isolation structure comprises silicon nitride.

16. The device of claim 14, further comprising a first spacer between the first diffusion and the insulating isolation structure and a second spacer between the second diffusion and the insulating isolation structure.

17. A method, comprising:
 forming a first diffusion on a substrate;
 forming a second diffusion on the substrate a distance from the first diffusion;
 forming an insulating isolation structure on the substrate between the first and second diffusions, the insulating isolation structure being self-aligned to the first and second diffusions, wherein forming the insulating isolation structure comprises:
  depositing a spacer layer on the first and second diffusions, the spacer layer defining a trench between the first and second diffusions; and depositing insulating material in the trench to form the insulating isolation structure; and removing at least a portion of the spacer layer after forming the insulating isolation structure, to expose side walls of the first and second diffusions; and forming, after forming the insulating isolation structure, a first transistor gate on the first diffusion and a second transistor gate on the second diffusion.

18. The method of claim 17, further comprising removing a portion of the insulating isolation structure after forming the first and second transistor gates.

19. The method of claim 17, further comprising depositing gate material on side walls of the first and second diffusions between each of the first and second diffusions and the insulating isolation structure.

* * * * *